US012725656B2

(12) United States Patent
Housley et al.

(10) Patent No.: US 12,725,656 B2
(45) Date of Patent: Sep. 1, 2026

(54) INTEGRATED CIRCUITRY, MEMORY CIRCUITRY COMPRISING STRINGS OF MEMORY CELLS, AND METHODS USED IN FORMING INTEGRATED CIRCUITRY

(71) Applicant: Micron Technology, Inc., Boise, ID (US)

(72) Inventors: Richard T. Housley, Boise, ID (US); Quinn L. Roberts, Boise, ID (US); Shruthi Kumara Vadivel, Boise, ID (US); Harsh Narendrakumar Jain, Boise, ID (US); Tien Minh Quan Tran, Singapore (SG); Zhen Feng Yow, Singapore (SG); Wei Deng Leong, Singapore (SG); Kah Sing Chooi, Singapore (SG); Nils Monserud, Half Moon Bay, CA (US)

(73) Assignee: Micron Technology, Inc., Boise, ID (US)

(*) Notice: Subject to any disclaimer, the term of this patent is extended or adjusted under 35 U.S.C. 154(b) by 353 days.

(21) Appl. No.: 18/420,201

(22) Filed: Jan. 23, 2024

(65) Prior Publication Data

US 2024/0257875 A1 Aug. 1, 2024

Related U.S. Application Data

(60) Provisional application No. 63/441,384, filed on Jan. 26, 2023.

(51) Int. Cl.

| | |
|---|---|
| ***G11C 16/04*** | (2006.01) |
| ***H10B 41/10*** | (2023.01) |

(Continued)

(52) U.S. Cl.

CPC ......... *G11C 16/0483* (2013.01); *H10B 41/10* (2023.02); *H10B 41/27* (2023.02);

(Continued)

(58) Field of Classification Search

CPC . H10W 46/00; H10W 46/501; H10W 46/301; G11C 16/0483; H10B 41/10;

(Continued)

(56) References Cited

U.S. PATENT DOCUMENTS

| | | | | |
|---|---|---|---|---|
| 12,265,335 B2 * | 4/2025 | Yamashita | .......... | G03F 7/70683 |
| 2014/0154886 A1 * | 6/2014 | Brown | .................... | G03F 9/708 438/700 |

(Continued)

*Primary Examiner* — Alonzo Chambliss

(74) *Attorney, Agent, or Firm* — Wells St. John P.S.

(57) ABSTRACT

A method used in forming integrated circuitry comprises forming a stack comprising vertically-alternating first tiers and second tiers of different compositions relative one another. The stack extends from individual die areas to and across scribe-line area that is between immediately-adjacent of the individual die areas. A registration mark is formed in the scribe-line area. The registration mark comprises parallel first bars atop the stack having first spaces therebetween. A masking material is directly above the stack, the first bars, and the first spaces. The masking material comprises parallel second bars having second spaces therebetween. The second spaces individually have width that is less than width of individual of the second bars. Some of the masking material is spaced laterally-outward of the second bars. Vertical thickness of the some masking material that is laterally-outward of the second bars have a vertical thickness laterally-outward of the first spaces that is greater than vertical thickness of the second bars. Ratio of the vertical thickness of the some masking material that is laterally-outward of the second bars divided by the width of the second bars is 6.0 to 9.6. After forming the registration mark, the first bars and the first and second tiers in the scribe-line area are cut through to form individual die that individually comprise one of the individual die areas. Other embodiments, including structure independent of method, are disclosed.

15 Claims, 14 Drawing Sheets

(51) Int. Cl.
*H10B 41/27* (2023.01)
*H10B 41/35* (2023.01)
*H10B 43/10* (2023.01)
*H10B 43/27* (2023.01)
*H10B 43/35* (2023.01)
*H10W 46/00* (2026.01)

(52) U.S. Cl.
CPC ............. *H10B 41/35* (2023.02); *H10B 43/10* (2023.02); *H10B 43/27* (2023.02); *H10B 43/35* (2023.02); *H10W 46/301* (2026.01); *H10W 46/501* (2026.01); *H10W 46/503* (2026.01)

(58) Field of Classification Search
CPC ........ H10B 43/35; H10B 41/35; H10B 43/10; H10B 41/27; H10B 43/27
See application file for complete search history.

(56) References Cited

U.S. PATENT DOCUMENTS

2020/0219821 A1* 7/2020 Cheng ................... H10P 74/203
2023/0282596 A1* 9/2023 Kleinbichler ......... H10W 46/00
257/213

* cited by examiner 10
90
44
39
42
33
43
45
W1
W2
V1
V2
18
11
20
22
24
26

10
67
73
70
69
90
200
14
71
11
12
19
15
43
42
41
33
68
87
88
100

10
99
200
85
99

100
99
99
200
99
99
85
100
99
99

10
71
200
69
99
100
88
12
90W
70

42
73
67
87
19
41
33
14
43
68
42
15

69

10a
90
200
88
100
12

87
15
19
39
43
42a
33
41
14

INTEGRATED CIRCUITRY, MEMORY CIRCUITRY COMPRISING STRINGS OF MEMORY CELLS, AND METHODS USED IN FORMING INTEGRATED CIRCUITRY

TECHNICAL FIELD

Embodiments disclosed herein pertain integrated circuitry, to memory circuitry comprising strings of memory cells, and to methods used in forming integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

Integrated circuitry such as memory circuitry described above is commonly manufactured in a sequence of patterning steps of one or more layers formed over a substrate such as a semiconductor wafer. Thereby, electronic components of the circuitry (e.g., transistors, capacitors, conductive vias, etc.) made of various materials are deposited onto the substrate in layers and patterned individually or multiple layers at a time. The separate patterning steps need to be aligned correctly relative one another, for example using a process commonly referred to a lithography. The semiconductor wafer is typically fabricated to have a plurality of individual die areas that are separated by scribe-line area. Each die area is fabricated to ultimately contain a complete integrated circuit that at the conclusion of processing is isolated by cutting through the scribe-line area to form individual integrated circuit chips (die) from the former interconnected individual die areas.

In patterning within the individual die areas, using lithography for example, a masking tool (e.g., a reticle) and the semiconductor wafer must be precisely x-y aligned relative one another. Patterns are typically formed in the scribe-line area which are examined by the lithography equipment for achieving proper x-y alignment and for determining whether acceptable x-y alignment was achieved. One of such patterns is commonly known as an alignment mark. Multiple of these would typically be placed within the scribe-line area and individually include a plurality of features for which the lithography equipment can optically scan to determine and modify x-y alignment of the wafer and masking tool prior to patterning. Another of such patterns is commonly known as a registration mark. Multiple of these would also typically be formed in the scribe-line area, with the lithography equipment being used to optically scan the registration marks to determine whether proper x-y alignment was achieved after the patterning.

DETAILED DESCRIPTION OF EXAMPLE EMBODIMENTS

Embodiments of the invention encompass methods of forming integrated circuitry and integrated circuitry regardless of method of manufacture. One example form of such integrated circuitry is memory, although not all aspects of the inventions disclosed herein are so limited. Example methods of forming integrated circuitry are described with reference to FIGS. 1-20.

Figure 1:
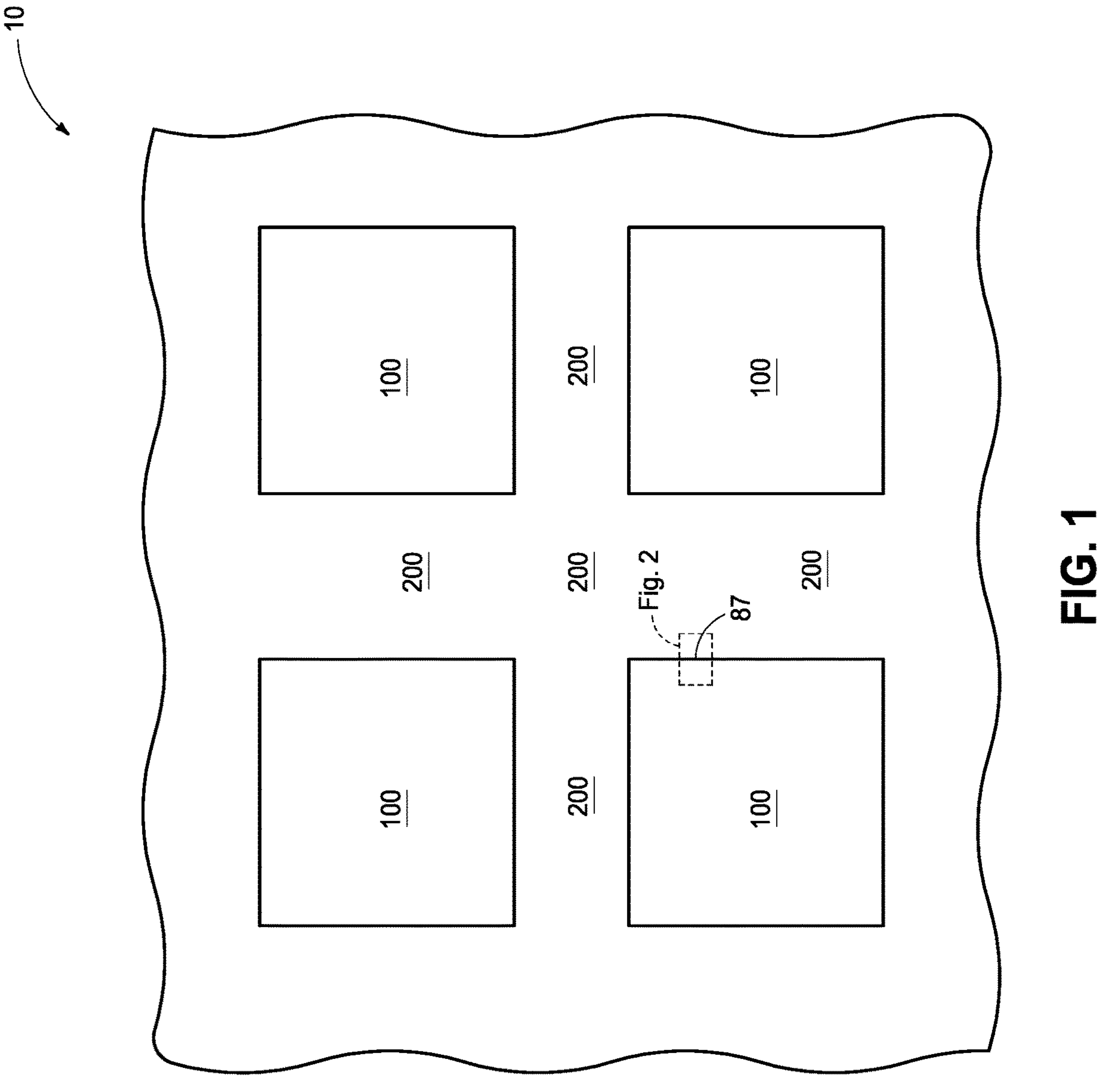
FIG. 1 is a diagrammatic top plan view of a substrate in process in accordance with an embodiment of the invention.
Figure 2:
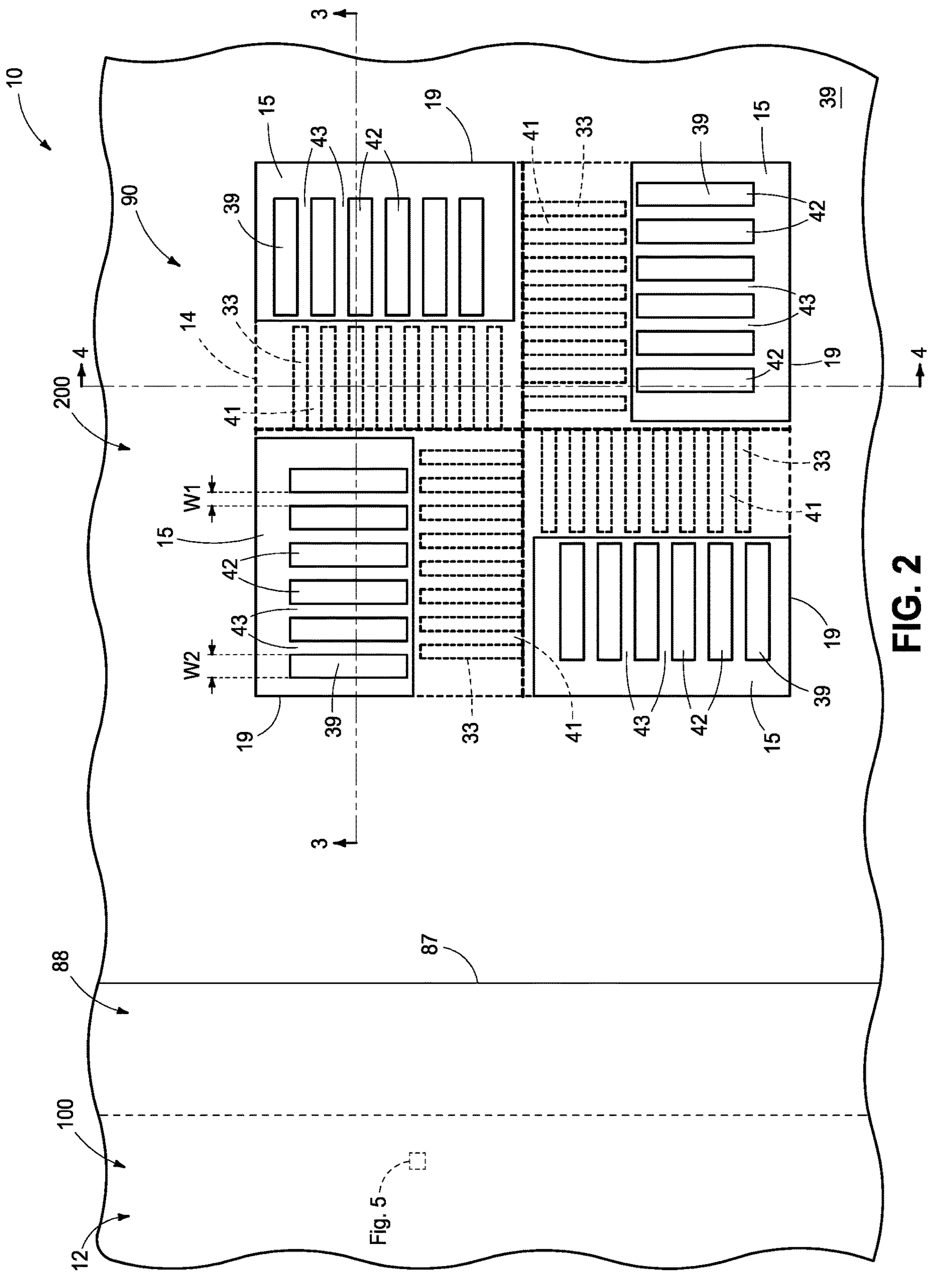
FIG. 2 is an enlargement of a portion of FIG. 1.
Figure 3:
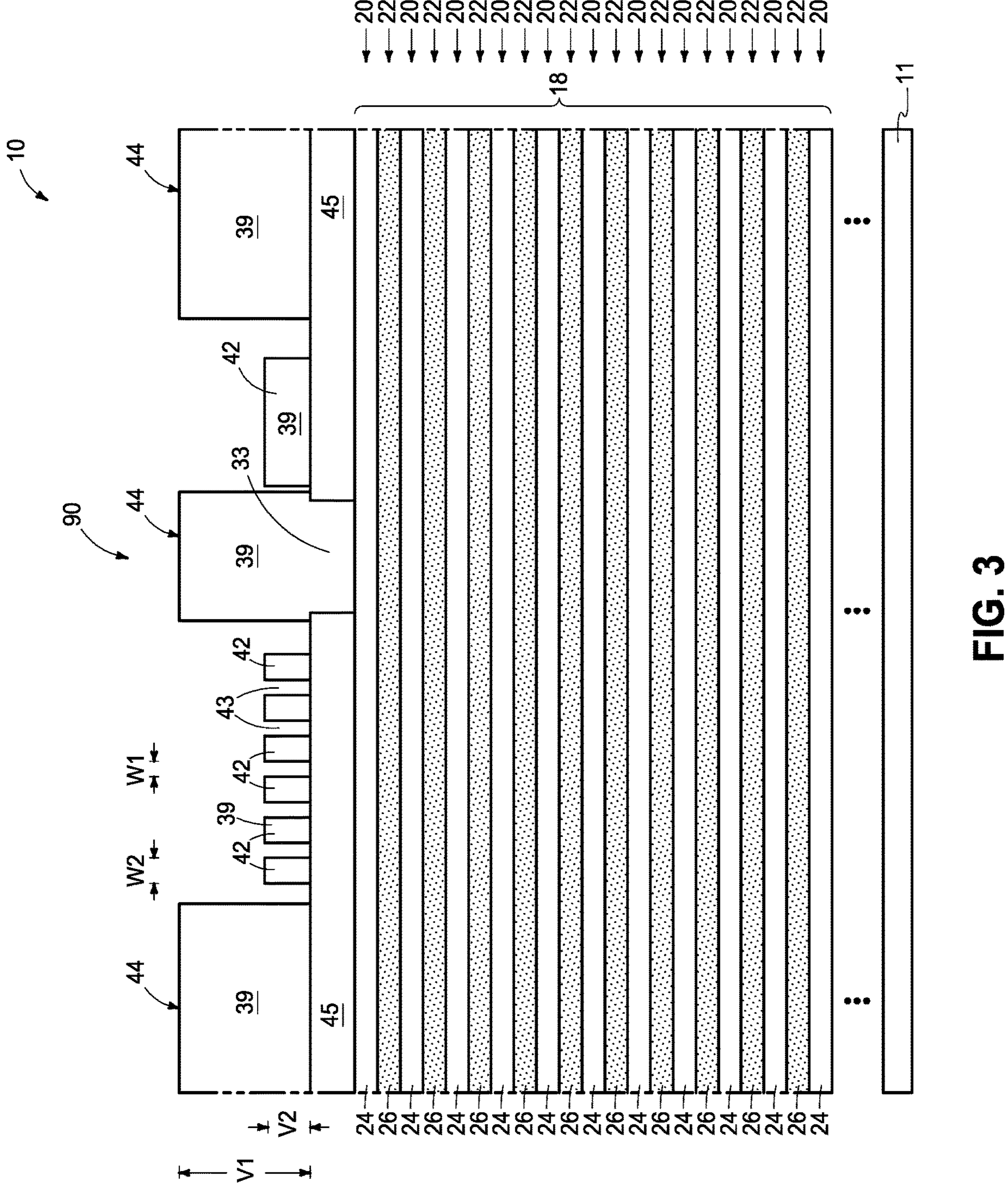
FIGS. 3 and 5 are enlargements of portions of FIG. 2.
Figure 4:
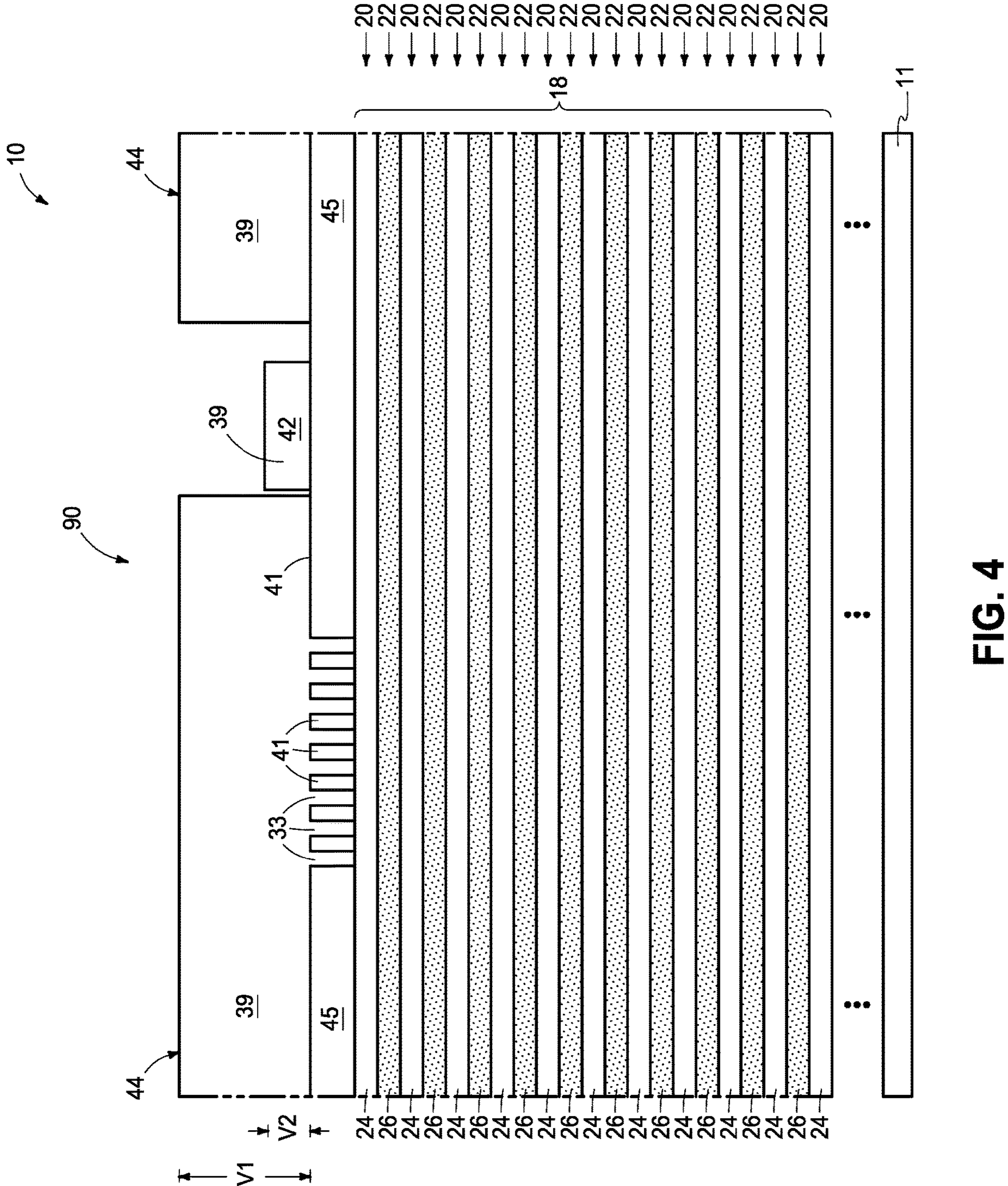
FIGS. 4 and 6-20 are diagrammatic sequential sectional, expanded, enlarged, and/or partial views of the construction of FIGS. 1-3 and 5, or portions thereof, and/or alternate embodiments in process in accordance with some embodiments of the invention.
Figure 6:
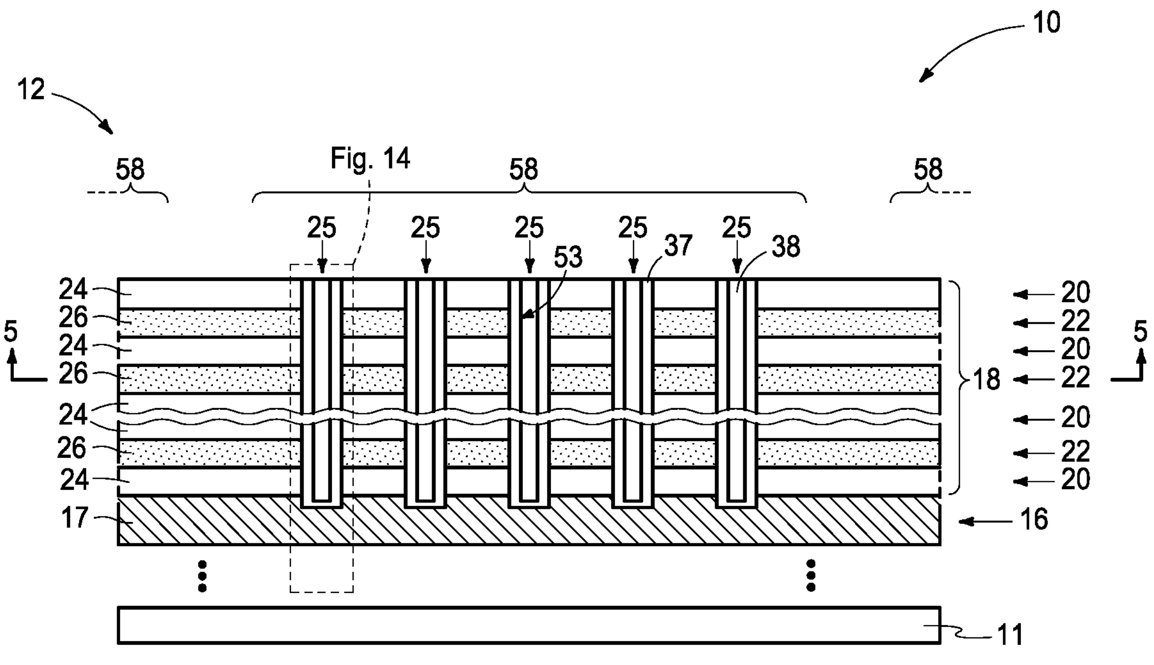
Figure 7:
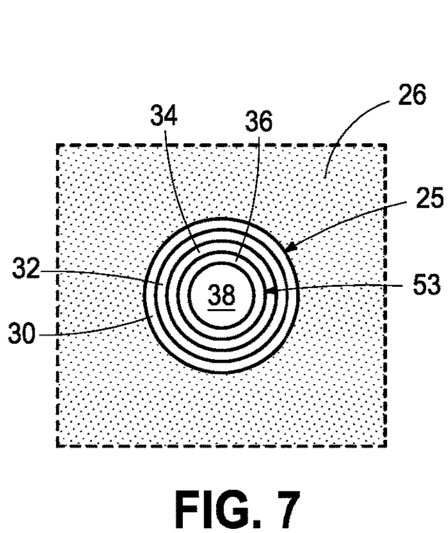
Figure 8:
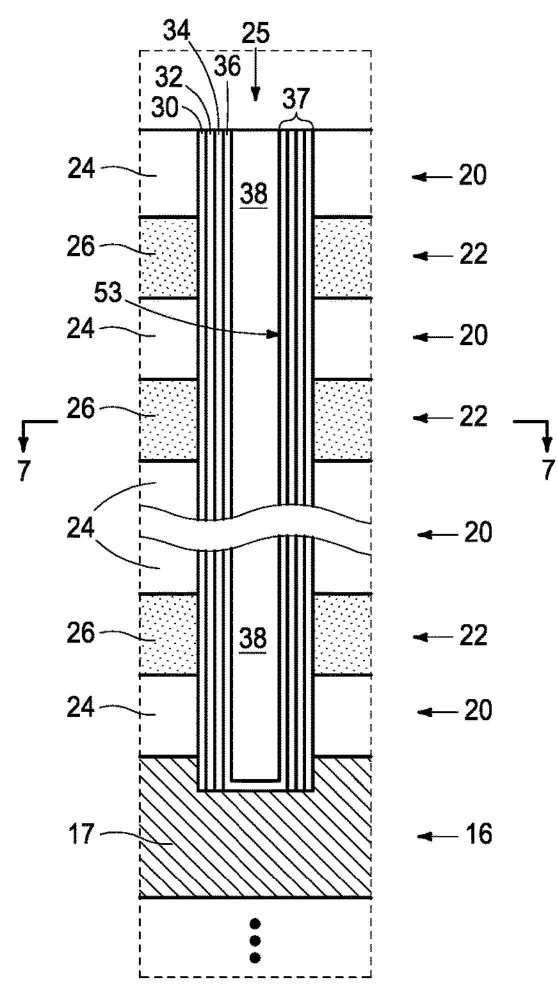
Figures 5, 9:
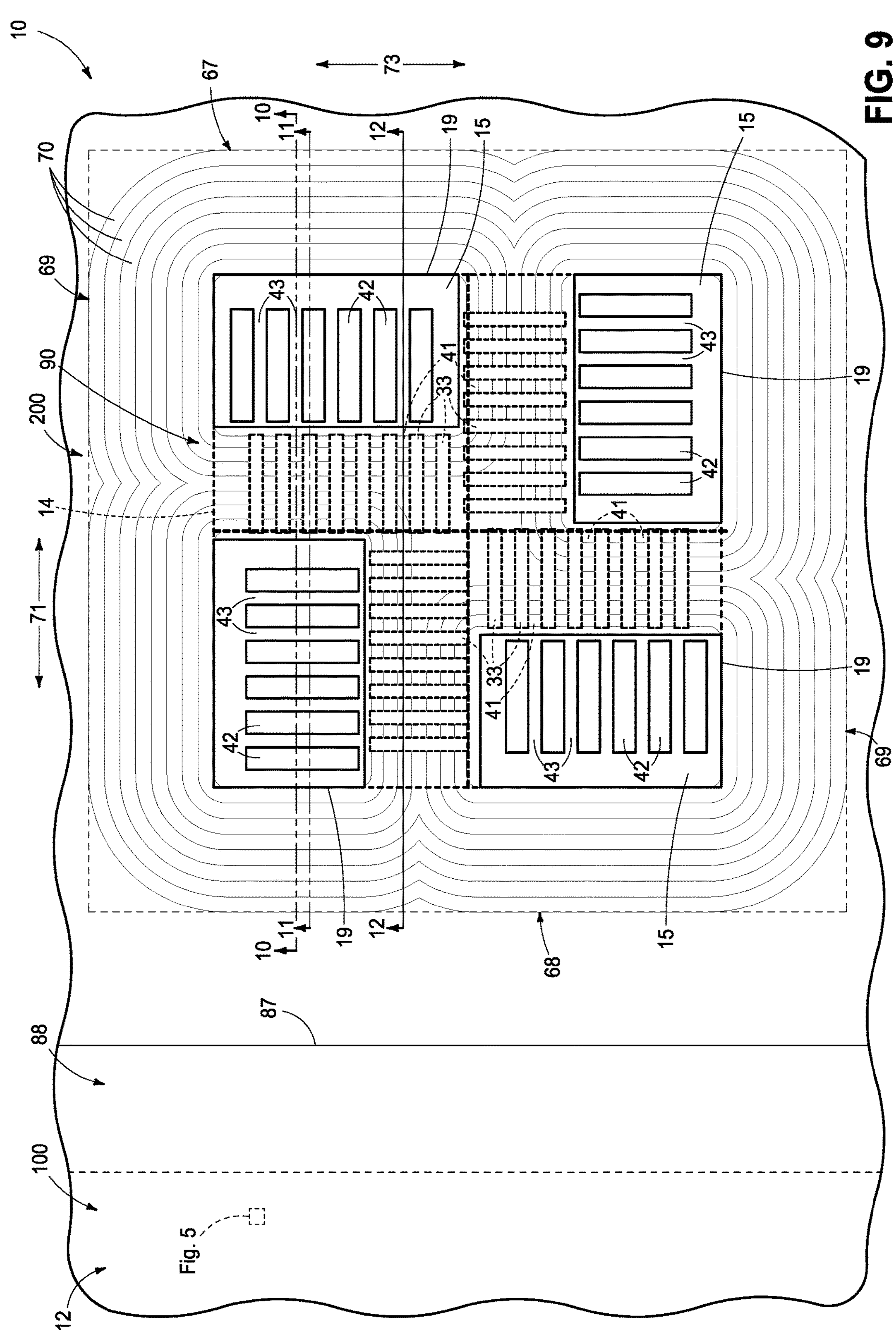
Figure 10:
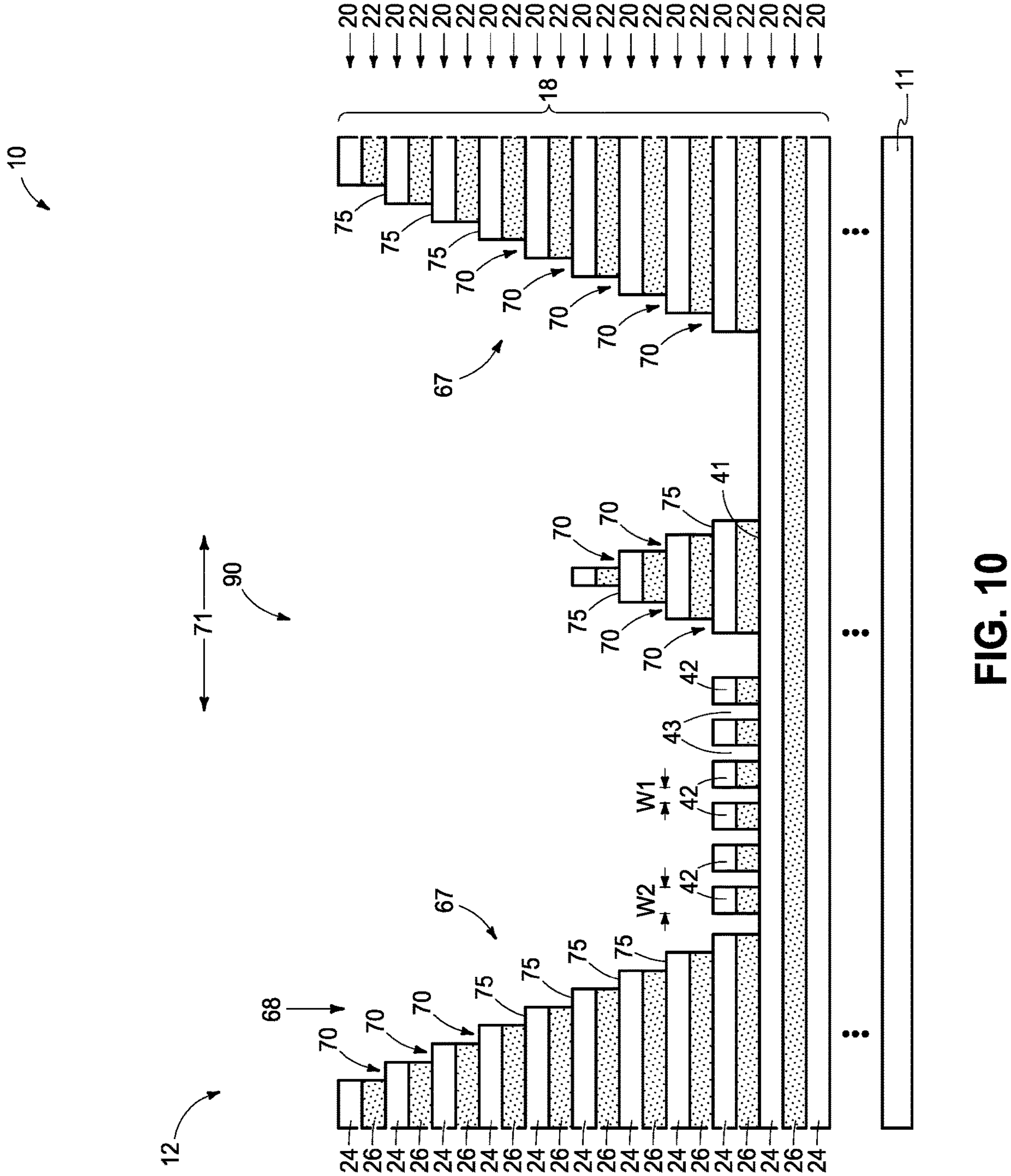
Figure 11:
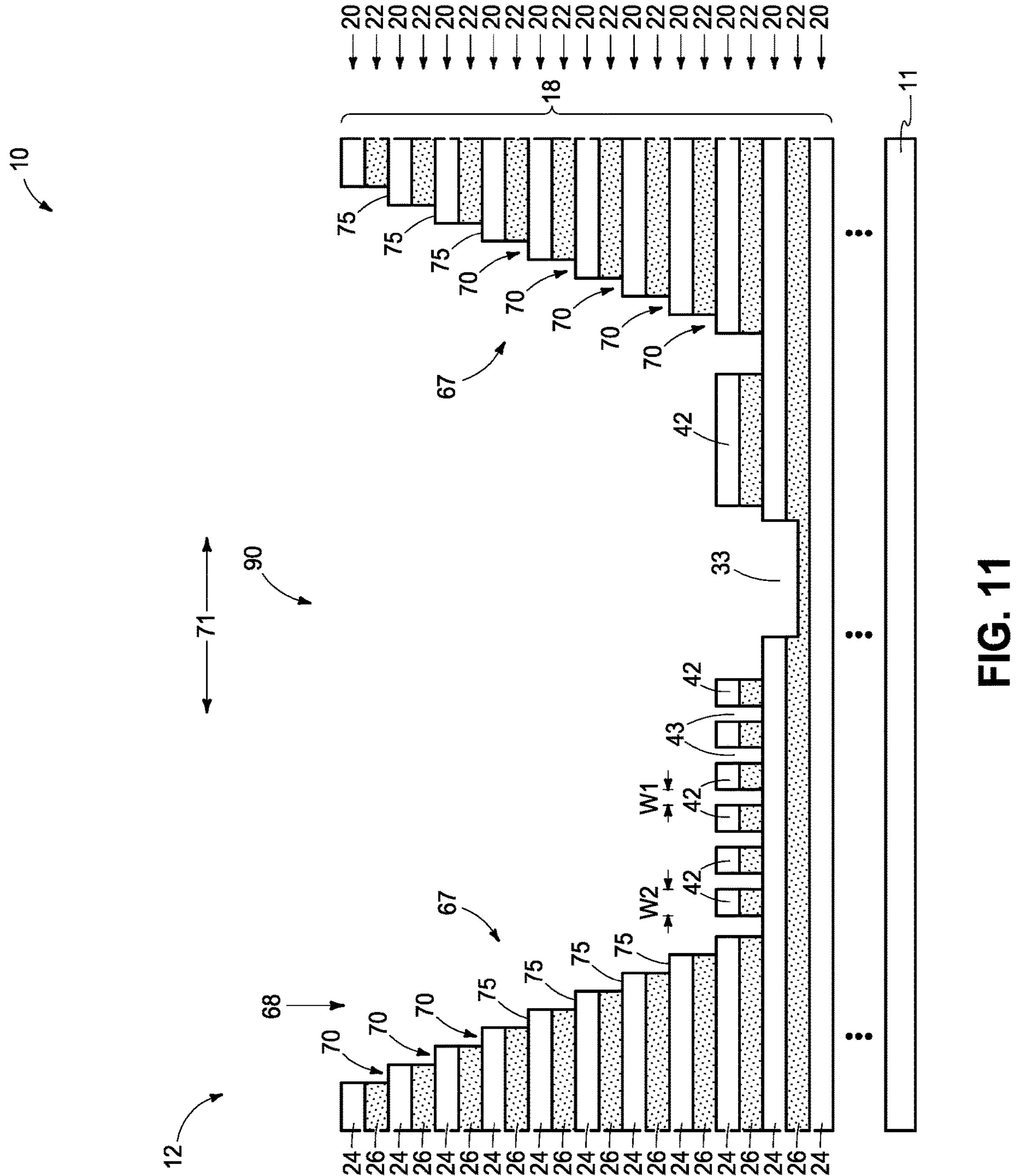
Figure 12:
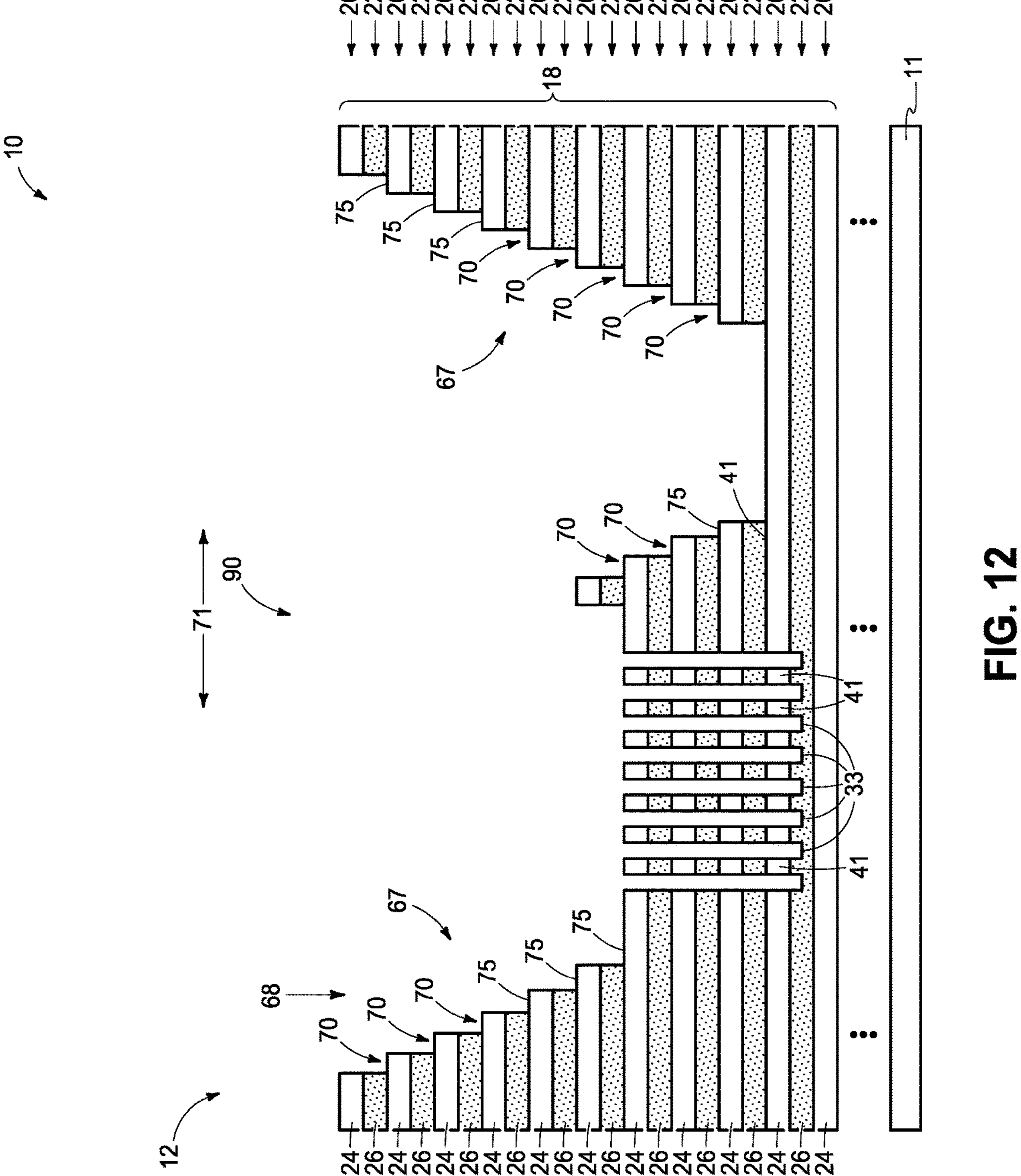
Figure 13:
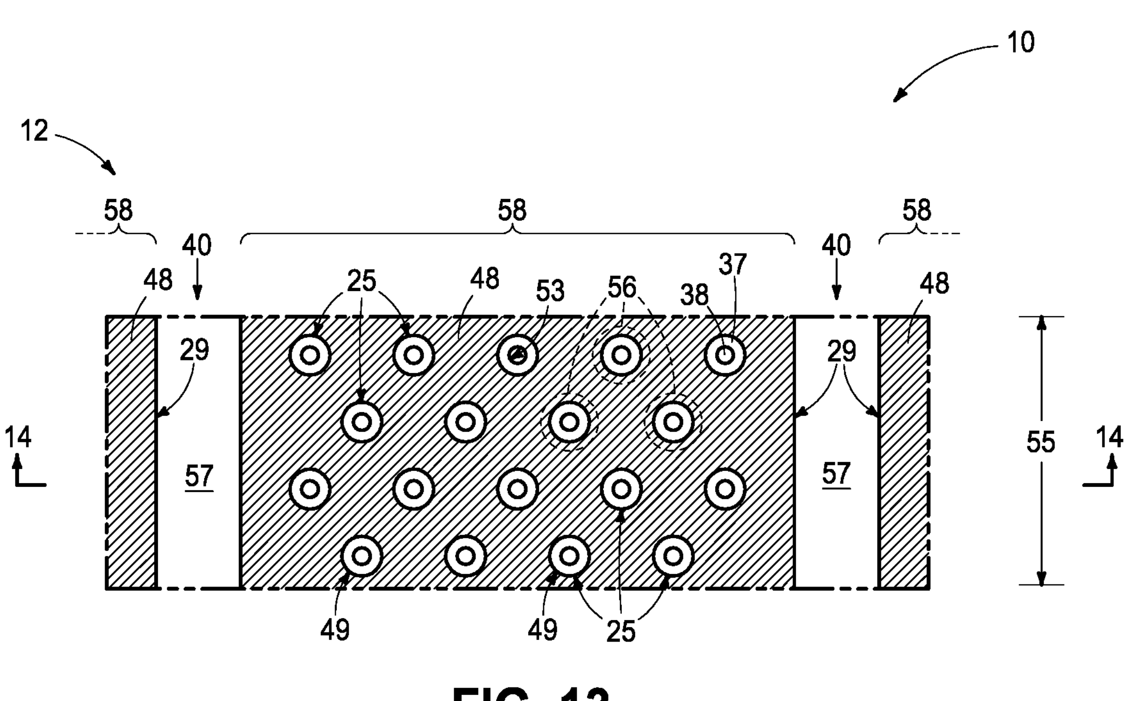
Figure 14:
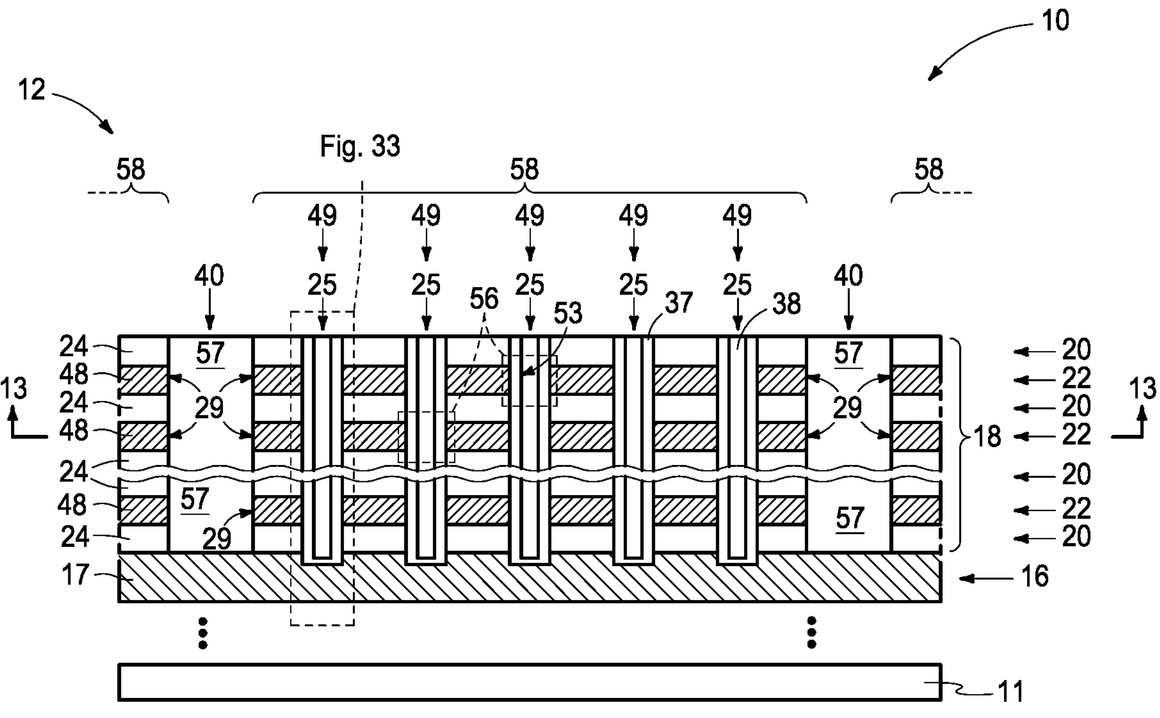
Figure 15:
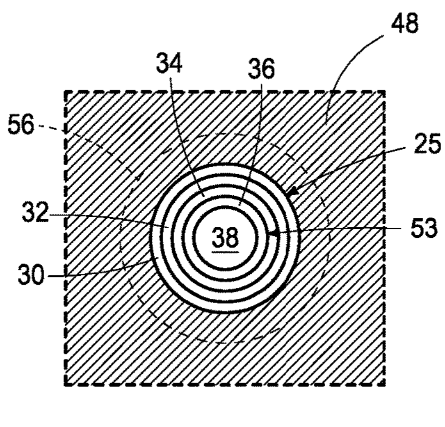
Figure 16:
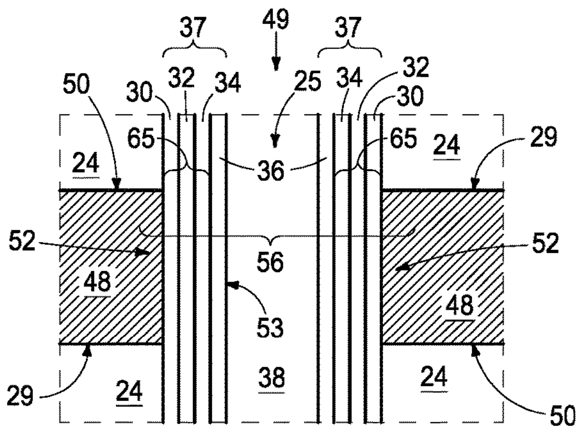
Figure 17:
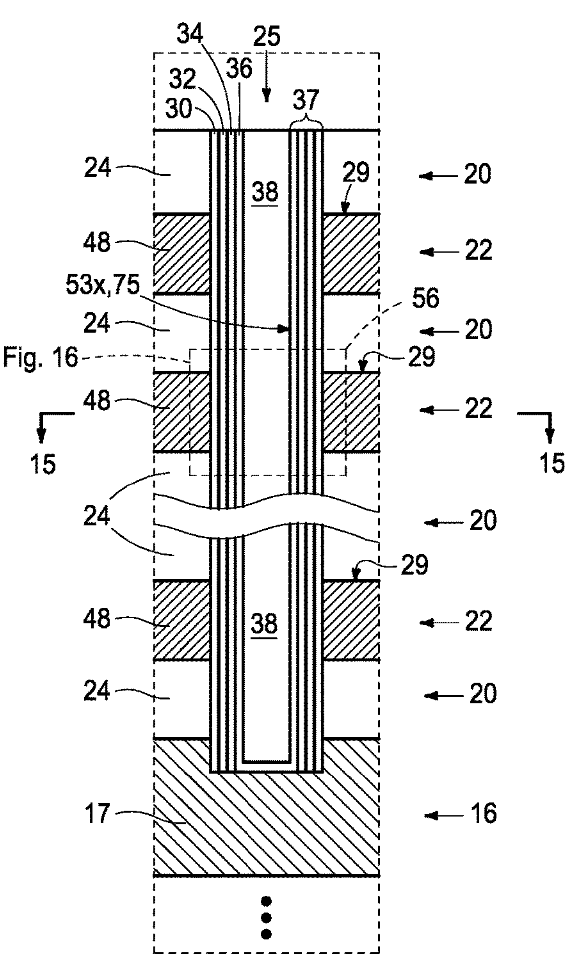
Figures 13, 18, 19:
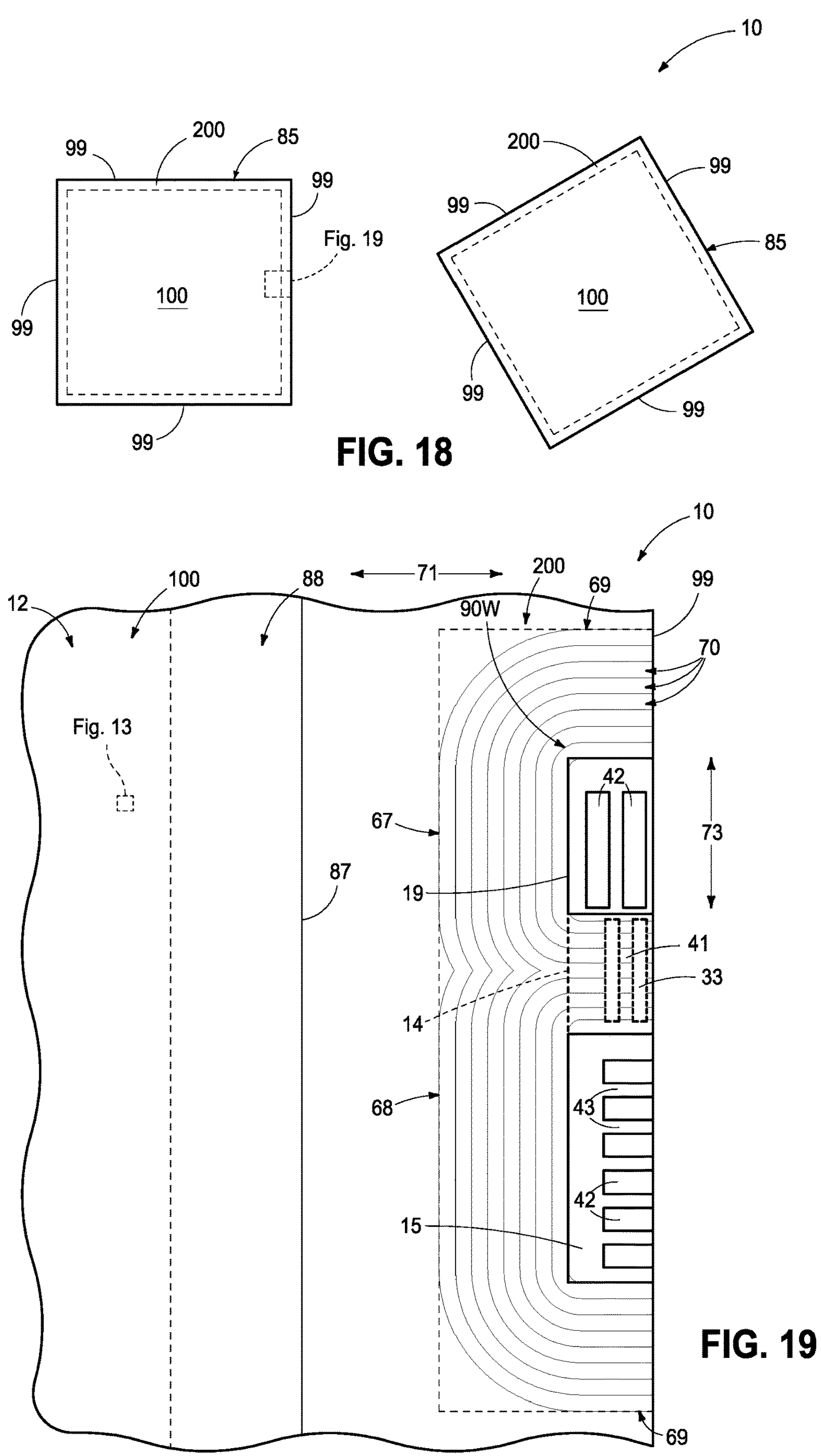

Referring to FIG. 1, such shows a portion of a construction 10 (e.g., a portion of a semiconductor wafer) comprising individual die areas 100 having scribe-line area 200 therebetween. A registration mark or an alignment mark will be fabricated in scribe-line area 200, with likely multiple such registration marks and/or alignment marks being fabricated. Multiple such marks may be fabricated that may be of the same or different configuration(s) relative one another.

Referring to FIGS. 2-8, such are enlarged views of a portion of FIG. 1 showing a die area 100 and an immediately-adjacent scribe-line area 200. In the example embodiment, memory circuitry comprising strings of memory cells are being fabricated. Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry such as that comprising a memory array comprising strings of memory cells (e.g., NAND architecture) independent of method of manufacture. Construction 10 comprises a base substrate 11 (e.g., part of a semiconductor wafer) that may comprise any one or more of conductive/conductor/conducting, semiconductive/semiconductor/semiconducting, and insulative/insulator/insulating (i.e., electrically herein) materials. Materials may be aside, elevationally inward, or elevationally outward of the FIGS. 3-8-depicted materials. For example, other partially or wholly fabricated components of integrated circuitry may be provided somewhere above, about, or within base substrate 11. Control and/or other peripheral circuitry for operating components within an array (e.g., a memory array) may also be fabricated and may or may not be wholly or partially with an array or sub-array. Further, multiple sub-arrays may also be fabricated and operated independently, in tandem, or otherwise relative one another. As used in this document, a "sub-array" may also be considered as an array.

Example construction 10 comprises a conductor tier 16 comprising conductor material 17 (e.g., $WSi_x$ under conductively-doped polysilicon) above substrate 11. Conductor tier 16 may comprise part of control circuitry (e.g., peripheral-under-array circuitry and/or a common source line or plate) used to control read and write access to the transistors and/or memory cells in an array 12. In an embodiment where the integrated circuitry being fabricated will comprise memory circuitry, example array 12 is a memory-array region 12 within individual die areas 100. Such may be juxtaposed relative to the edge(s) of individual die areas 100 (not shown) or be laterally-spaced therefrom (as shown), for example a space 88 being between array region 12 and an edge 87 of die area 100.

A stack 18 comprising vertically-alternating first tiers 22 and second tiers 20 is directly above conductor tier 16, with first tiers 22 comprising sacrificial material 26 (e.g., silicon nitride) and second tiers 20 comprising non-sacrificial material 24 that is of different composition from that of sacrificial material 26 (e.g., silicon dioxide). In some embodiments, first tiers 22 may be referred to as conductive tiers 22 and second tiers 20 may be referred to as insulative tiers 20, with first tiers 22 being conductive and second tiers 20 being insulative at least in a finished-circuitry construction in some embodiments. Example thickness for each of tiers 20 and 22 is 20 to 60 nanometers. The example uppermost tier 20 may be thicker/thickest compared to one or more other tiers 20 and/or 22. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the first tiers 22 and/or above an uppermost of the first tiers 22. For example, one or more select gate tiers (not shown) may be between conductor tier 16 and the lowest first tier 22 and one or more select gate tiers may be above an uppermost of first tiers 22 (not shown). Alternately or additionally, at least one of the depicted uppermost and lowest first tiers 22 may be a select gate tier.

Channel openings 25 have been formed (e.g., by etching) through insulative tiers 20 and conductive tiers 22 to conductor tier 16. Channel openings 25 may taper radially-inward and/or radially-outward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired and/or to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along first direction 55. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

The figures show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprises individual channel-material strings 53, in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space (s) (not shown) and/or be devoid of solid material (not shown).

Stack 18 extends from individual die areas 100 to and across scribe-line area 200 that is between immediately-adjacent individual die areas 100. The example-depicted scribe-line area 200 comprises a horizontal area 14 in which a registration mark (e.g., 90) has been or is being fabricated. Multiple such registration marks would likely be formed, with the discussion largely proceeding with respect to a single registration mark.

Registration mark 90 comprises parallel first bars 41 atop stack 18 (directly above or in the top thereof) having first spaces 33 therebetween. Example first bars 41 are shown as having been formed in a material 45 (that may be sacrificial) that is directly above stack 18. First bars 41 are shown as having ideal vertical sidewalls and constant lateral thickness (width), although such sidewalls may taper laterally-inward and/or laterally-outward (neither being shown) whereby lateral thickness thereof is not constant. Registration mark 90 comprises a masking material 39 directly above stack 18, first bars 41, and first spaces 33. Masking material 39 comprises parallel second bars 42 having second spaces 43 therebetween. Second bars 42 are shown as having ideal vertical sidewalls and constant lateral thickness, although such sidewalls may taper laterally-inward and/or laterally-outward (neither being shown) whereby lateral thickness (width) thereof is not constant. Second spaces 43 individually have width W1 that is less than width W2 of individual second bars 42. Some of masking material 39 is spaced laterally-outward of second bars 42 (e.g., a portion 44 in a vertical cross-section, such as that of FIG. 3). The some masking material 39/44 that is laterally-outward of second bars 42 has a vertical thickness V1 laterally-outward of first spaces 33 and second bars 42 have a vertical thickness V2, with V1 being greater than V2. Ratio of vertical thickness V1 of the some masking material 39/44 that is laterally-outward of second bars 42 divided by width W2 of second bars 42 is 6.0 to 9.6. In one ideal embodiment, V1 is 9.5 microns, V2 is 0.25 micron to 2.5 microns, W2 is 1.25 microns and therefore V1 divided by W2 is 7.6.

In one embodiment, second bars 42 individually have a ration of their vertical thickness to their width of 0.5 to 2.0. In one embodiment, masking material 39 comprises photoresist, with the vertical thickness of such photoresist laterally-outward of second bars 42 (portion 44) being 7.5 microns to 12.0 microns (e.g., 9.0 to 10.0 microns). In one embodiment, second bars 42 individually have a maximum width of 1.25 microns. In one embodiment, a plurality of second bars 42 and second spaces 43 are in individual of four horizontally-spaced peripheral regions 15 and in one embodiment a plurality of first bars 41 and first spaces 33 are in individual of four horizontally-spaced peripheral regions 15.

Lithography equipment may be used to scan the registration mark(s) to determine whether proper x-y alignment had been achieved in the patterning of masking material 39 in die areas 100. If so, processing of the semiconductor wafer using masking material 39 as a mask may proceed. If not so, masking material 39 may be removed and patterning started anew with another layer of masking material 39.

Referring to FIGS. 9-12, and in one embodiment and as shown, a flight 67 of stairs 70 has been formed in stack 18 and that circumferentially-surrounds horizontal area 14, and masking material 39 (not shown) has thereafter been removed (e.g., flight 67 being formed in part by a series of lateral-trimmings of masking material 39 [not shown] and etchings into stack 18 at least one tier 20 and one tier 22 at a time, with features 42, 43, 33, and 41 translating downwardly as shown, and materials 39, 45 [not shown] being removed in the processing). Stairs 70 individually comprise a tread 75 that individually comprises one of the first tiers 22 (at least one) and one of second tiers 20 (at least one). Example flight 67 of stairs 70 includes a first portion 68 (one being shown) that is between die-area edge 87 and horizontal area 14 and runs in a first direction 71 that is perpendicular to edge 87 of die area 100. Example flight 67 of stairs 70 includes a second portion 69 (two being shown) that runs in a second direction 73 that is parallel with edge 87 of die area 100.

In one embodiment and as shown, horizontal area 14 comprises four horizontally-spaced peripheral regions 15 that are individually in one of four peripheral quadrants 19 of horizontal area 14. Regions 15 may overlap into an immediately-adjacent quadrant 19 (not shown). In one embodiment, stairs 70 go into horizontal area 14 and in one such embodiment as shown circumferentially-surround individual of four horizontally-spaced peripheral regions 15.

Flights of stairs may also be formed in die areas 100 (e.g., commensurately with fabrication of flight(s) 67 and not shown), for example in stair-step structures as referred to in the above "Background" section. For example, such flights of stairs may be individually formed in one of multiple cavities that are longitudinally-spaced relative one another along direction 55 (not shown).

In the example method of forming memory circuitry comprising strings of memory cells using gate-last processing, sacrificial material 26 is at some point replaced with conducting material, for example as shown in FIGS. 13-17. Horizontally-elongated trenches 40 have been formed (e.g., by anisotropic etching) to extend through first tiers 22 and second tiers 20 in stack 18 and that are individually between immediately-laterally-adjacent memory-block regions 58. Trenches 40 may taper laterally-inward or laterally-outward moving deeper into stack 18 or otherwise be of varied width. A sacrificial etch-stop line (not shown) having the same general horizontal outline as individual trenches 40 may be formed in a lower portion of stack 18 prior to forming trenches 40. Trenches 40 may then be formed by etching materials 24 and 26 to stop on or within the material of the individual sacrificial lines, followed by exhuming remaining material of such sacrificial lines.

Thereafter, through the trenches, the sacrificial material of the first tiers 22 is replaced with conducting material that comprises control-gate lines in the memory-block regions. For example, sacrificial material 26 (not shown) of first tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in first tiers 22 in the example embodiment is sacrificial and has been replaced with conducting material 48, and which has thereafter been removed from trenches 40, thus forming individual control-gate lines 29 (e.g., wordlines) in stack 18 and elevationally-extending strings 49 of individual transistors and/or memory cells 56 in stack 18. Some, none, or all of sacrificial material 26 may be so-replaced by conducting material 48 in scribe-line area 200 (shown as not being so-replaced).

A thin insulative liner (e.g., $Al_2O_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conductive material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of silicon dioxide, silicon nitride, and aluminum oxide. Intervening material 57 may include through-array vias (not shown).

A registration mark 90 as described herein may be formed in any order relative to forming of other components (e.g., stairs 70, strings 49, trenches 40, etc.). Regardless, at some point after forming registration mark 90 and referring to FIGS. 18 and 19, first bars 41, first tiers 22, and second tiers 20 in scribe-line area 200 are cut through to form individual die 85 that individually comprise one of individual die areas 100. In one embodiment, individual die 85 comprise remaining-scribe-line area 200 at edge(s) 99 of the individual die in the finished-circuitry construction. A remnant 90*w* of registration or alignment mark 90 may be in remaining-scribe-line area 200 in the finished-circuitry construction and comprises parallel bars 42 in stack 18 having spaces 43 therebetween, with such spaces individually having width W1 that is less than width W2 of individual of such bars.

Any other attribute(s) or aspect(s) as shown and/or described herein with respect to other embodiments may be used in the embodiments shown and described with reference to the above embodiments.

Figure 5:
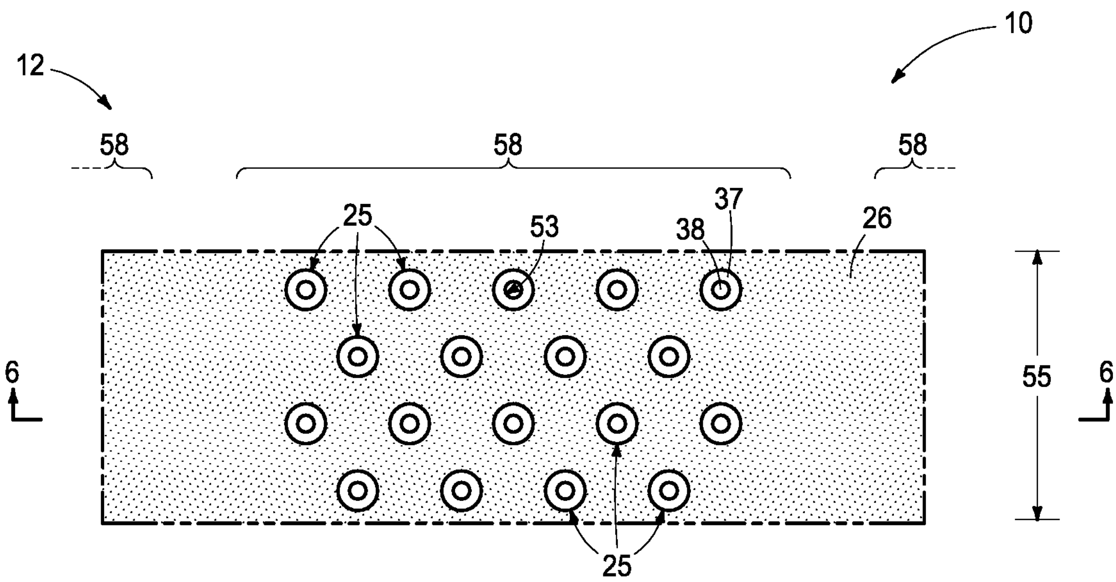
Figures 5, 20:
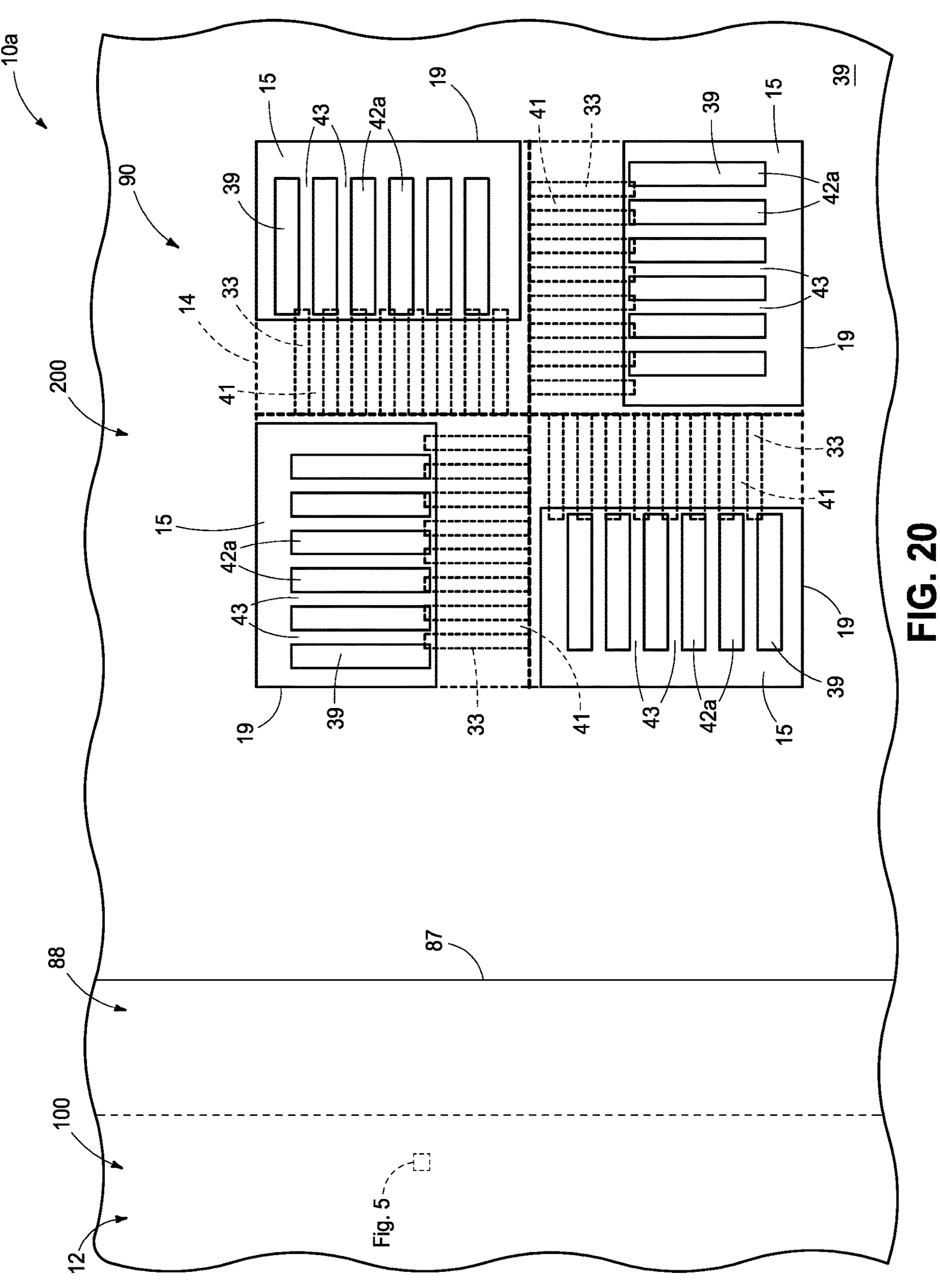

Construction 10 comprises and embodiment where none of second bars 42 is directly above any part of any of first bars 41. FIG. 20 diagrammatically shows an example construction 10*a* (corresponding to that of FIG. 2) where at least some of second bars 42*a* individually include at least a portion thereof that is directly above some portion of some of first bars 41. Like numerals from the above-described embodiments have been used where appropriate, with some construction differences being indicated with the suffix "a" or with different numerals. Some of such overlap may be desired depending on distance between immediately-adjacent die areas 100 across scribe-line area 200. Any other attribute(s) or aspect(s) as shown and/or described herein with respect to other embodiments may be used.

In one embodiment, a method used in forming integrated circuitry (e.g., 10) comprises forming a stack (e.g., 18) comprising vertically-alternating first tiers (e.g., 22) and second tiers (e.g., 20) of different compositions relative one another. The stack extends from individual die areas (e.g., 100) to and across scribe-line area (e.g., 200) that is between immediately-adjacent of the individual die areas. A registration mark (e.g., 90) is in the scribe-line area and comprises parallel first bars (e.g., 41) atop the stack and having first spaces (e.g., 33) therebetween. A masking material (e.g., 39) is directly above the stack, the first bars, and the first spaces. The masking material comprises parallel second bars (e.g., 42) having second spaces (e.g., 43) therebetween. The second spaces individually have width (e.g., W1) that is less than width (e.g., W2) of individual of the second bars. Some of the masking material (e.g., 44) is spaced laterally-outward of the second bars. Ratio of vertical thickness (e.g., V1) of the some masking material that is laterally-outward of the second bars divided by the width of the second bars is 6.0 to 9.6. After forming the registration mark, the first bars and the first and second tiers in the scribe-line area are cut through to form individual die (e.g., 85) that individually comprise one of the individual die areas (e.g., regardless of whether stairs 70 are formed). Any other attribute(s) or aspect(s) as shown and/or described herein with respect to other embodiments may be used.

Heretofore, registration marks formed using 9.5 microns thick photoresist (e.g., 39 and V1) and 1.25 microns wide second bars (e.g., 42 and W2) having 1.25 wide second spaces (e.g., 43 and W1) therebetween would also be expected to have second-bar thickness (e.g., V2) of 9.5 microns which would not work due to too great of an aspect ratio. It's been discovered that reducing W2 results in a shorter V2 likely due to reflectivity and interference which provides acceptable aspect ratio so that second bars don't topple.

Alternate embodiment constructions may result from method embodiments described above, or otherwise. Regardless, embodiments of the invention encompass memory arrays independent of method of manufacture. Nevertheless, such memory arrays may have any of the attributes as described herein method embodiments. Likewise, the above-described method embodiments may incorporate, form, and/or have any of the attributes described with respect to device embodiments.

In one embodiment, integrated circuitry (e.g., 10) comprises a die (e.g., 85) comprising remaining-scribe-line area (e.g., 200) at an edge (e.g., 99) of the die. Operative circuitry (e.g., 49) is in the die laterally-inward of the remaining-scribe-line area away from the edge of the die. The operative circuitry comprises vertically-alternating first tiers (e.g., 22) and second tiers (e.g., 20) that extend into the remaining-scribe-line area. A remnant of a registration mark (e.g., 90W) is in the remaining-scribe-line area. The remnant comprises parallel bars (e.g., 42) in the stack having spaces (e.g., 43) therebetween. The spaces individually have width (e.g., W1) that is less than width (e.g., W2) of individual of the bars. A flight (e.g., 67) of stairs (e.g., 70) is in the remaining-scribe-line area spaced laterally-outward of the bars. The stairs individually comprise a tread (e.g., 75) comprising one of the first tiers and one of the second tiers.

In one embodiment, the flight of stairs is between the remnant and the operative circuitry and includes a portion (e.g., 68) that runs in a direction (e.g., 71) that is perpendicular to the edge of the die. In one embodiment, the flight of stairs includes a portion (e.g., 69) that runs in a direction (e.g., 73) that is parallel with the edge of the die. In one embodiment, the flight of stairs includes a first portion (e.g., 68) that is between the remnant and the operative circuitry and runs in a first direction (e.g., 71) that is perpendicular to the edge of the die and the flight of stairs includes a second portion (e.g., 69) that runs in a second direction (e.g., 73) that is parallel with the edge of the die. In one embodiment, the integrated circuitry comprises memory circuitry and the operative circuitry comprise operative channel-material strings (e.g., 53) of memory cells (e.g., 56) extending through the first and second tiers.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layer). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, “elevationally-extending” and “extend(ing) elevationally” refer to a direction that is angled away by at least 45° from exactly horizontal. Further, “extend(ing) elevationally”, “elevationally-extending”, “extend(ing) horizontally”, “horizontally-extending” and the like with respect to a field effect transistor are with reference to orientation of the transistor’s channel length along which current flows in operation between the source/drain regions. For bipolar junction transistors, “extend(ing) elevationally” “elevationally-extending”, “extend(ing) horizontally”, “horizontally-extending” and the like, are with reference to orientation of the base length along which current flows in operation between the emitter and collector. In some embodiments, any component, feature, and/or region that extends elevationally extends vertically or within 10° of vertical.

Further, “directly above”, “directly below”, and “directly under” require at least some lateral overlap (i.e., horizontally) of two stated regions/materials/components relative one another. Also, use of “above” not preceded by “directly” only requires that some portion of the stated region/material/component that is above the other be elevationally outward of the other (i.e., independent of whether there is any lateral overlap of the two stated regions/materials/components). Analogously, use of “below” and “under” not preceded by “directly” only requires that some portion of the stated region/material/component that is below/under the other be elevationally inward of the other (i.e., independent of whether there is an lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, “thickness” by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness and/or width or of variable thicknesses and/or width. If of variable thickness and/or width, thickness and/or width refers to average thickness and/or width unless otherwise indicated, and such material or region will have some minimum thickness and/or width and some maximum thickness and/or width due to the thickness and/or width being variable. As used herein, “different composition” only requires those portions of two stated materials or regions that may be directly against one another to be chemically and/or physically different, for example if such materials or regions are not homogenous. If the two stated materials or regions are not directly against one another, “different composition” only requires that those portions of the two stated materials or regions that are closest to one another be chemically and/or physically different if such materials or regions are no homogenous. In this document, a material, region, or structure is “directly against” another when there is at least some physical touching contact of the stated materials, regions, or structures relative one another. In contrast, “over”, “on”, “adjacent”, “along”, and “against” not preceded by “directly” encompass “directly against” as well as construction where intervening material(s), region(s), or structure(s) result(s) in no physical touching contact of the stated materials, regions, or structures relative one another.

Herein, regions-materials-components are “electrically coupled” relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being “directly electrically coupled”, no intervening electronic component (e.g., no diode, transistor, resistor, transducer, switch, fuse, etc.) is between the directly electrically coupled regions-materials-components.

Any use of “row” and “column” in this document is for convenience in distinguishing one series or orientation of features from another series or orientation of features and along which components have been or may be formed. “Row” and “column” are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. “Metal material” is any one or combination of an elemental metal, any mixture or alloy of two or more elemental metals, and any one or more metallic compound(s).

Herein, any use of “selective” as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of “or” herein encompasses either and both.

Conclusion

In some embodiments, a method used in forming integrated circuitry comprises forming a stack comprising vertically-alternating first tiers and second tiers of different compositions relative one another. The stack extends from individual die areas to and across scribe-line area that is between immediately-adjacent of the individual die areas. A registration mark is formed in the scribe-line area. The registration mark comprises parallel first bars atop the stack having first spaces therebetween. A masking material is directly above the stack, the first bars, and the first spaces. The masking material comprises parallel second bars having second spaces therebetween. The second spaces individually have width that is less than width of individual of the second bars. Some of the masking material is spaced laterally-outward of the second bars. Vertical thickness of the some masking material that is laterally-outward of the second bars have a vertical thickness laterally-outward of the first spaces that is greater than vertical thickness of the second bars. Ratio of the vertical thickness of the some masking material that is laterally-outward of the second bars divided by the width of the second bars is 6.0 to 9.6. After forming the registration mark, the first bars and the first and second tiers in the scribe-line area are cut through to form individual die that individually comprise one of the individual die areas.

In some embodiments, a method used in forming memory circuitry comprising strings of memory cells comprises forming a stack comprising vertically-alternating first tiers and second tiers. The stack extends from individual die areas to and across scribe-line area that is between immediately-adjacent of the individual die areas. The stack comprises a memory array region within the individual die areas and a horizontal area in the scribe-line area. Channel-material strings extend through the first and second tiers in the memory-array region. A registration mark is formed in the horizontal area of the scribe-line area. The registration mark comprises parallel first bars atop the stack having first spaces therebetween. A masking material is directly above the stack, the first bars, and the first spaces. The masking material comprises parallel second bars having second spaces therebetween. The second spaces individually have width that is less than width of individual of the second bars. Some of the masking material is spaced laterally-outward of the second bars. Vertical thickness of the some masking material that is laterally-outward of the second bars has a vertical thickness laterally-outward of the first spaces that is greater than vertical thickness of the second bars. Ratio of the vertical thickness of the some masking material that is laterally-outward of the second bars divided by the width of the second bars is 6.0 to 9.6. A flight of stairs is formed in the stack in the scribe-line area and circumferentially-surrounds the horizontal area. The stairs individually comprise a tread comprising one of the first tiers and one of the second tiers. After forming the registration mark, the first bars, the first and second tiers, and the flight of stairs in the scribe-line area are cut through to form individual die that individually comprise one of the individual die areas.

In some embodiments, integrated circuitry comprising a die comprises remaining-scribe-line area at an edge of the die. Operative circuitry in the die is laterally-inward of the remaining-scribe-line area away from the edge of the die. The operative circuitry comprises vertically-alternating first tiers and second tiers that extend into the remaining-scribe-line area. A remnant of a registration mark is in the remaining-scribe-line area. The remnant comprises parallel bars in the stack having spaces therebetween. The spaces individually have width that is less than width of individual of the bars. A flight of stairs in the remaining-scribe-line area is spaced laterally-outward of the bars. The stairs individually comprise a tread comprising one of the first tiers and one of the second tiers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:

forming a stack comprising vertically-alternating first tiers and second tiers of different compositions relative one another, the stack extending from individual die areas to and across scribe-line area that is between immediately-adjacent of the individual die areas;

forming a registration mark in the scribe-line area, the registration mark comprising:

parallel first bars atop the stack having first spaces therebetween; and a masking material directly above the stack, the first bars, and the first spaces; the masking material comprising parallel second bars having second spaces therebetween, the second spaces individually having width that is less than width of individual of the second bars, some of the masking material being spaced laterally-outward of the second bars, vertical thickness of the some masking material that is laterally-outward of the second bars having a vertical thickness laterally-outward of the first spaces that is greater than vertical thickness of the second bars, ratio of the vertical thickness of the some masking material that is laterally-outward of the second bars divided by the width of the second bars being 6.0 to 9.6; and after forming the registration mark, cutting through the first bars and the first and second tiers in the scribe-line area to form individual die that individually comprise one of the individual die areas.

2. The method of claim 1 wherein the second bars individually have a ratio of their vertical thickness to their width of 0.2 to 2.0.

3. The method of claim 1 wherein the masking material comprises photoresist, the vertical thickness of the photoresist laterally-outward of the second bars being 7.5 microns to 12.0 microns.

4. The method of claim 3 wherein the second bars individually have a maximum width of 1.25 microns.

5. The method of claim 3 wherein the vertical thickness of the photoresist laterally-outward of the second bars is 9.0 to 10.0 microns.

6. The method of claim 1 wherein none of the second bars is directly above any part of any of the first bars.

7. The method of claim 1 wherein at least some of the second bars individually include at least a portion thereof that is directly above some portion of some of the first bars.

8. A method used in forming memory circuitry comprising strings of memory cells, comprising:

forming a stack comprising vertically-alternating first tiers and second tiers, the stack extending from individual die areas to and across scribe-line area that is between immediately-adjacent of the individual die areas, the stack comprising a memory-array region within the individual die areas and a horizontal area in the scribe-line area, channel-material strings extending through the first and second tiers in the memory-array region;

forming a registration mark in the horizontal area of the scribe-line area, the registration mark comprising:

parallel first bars atop the stack having first spaces therebetween; and a masking material directly above the stack, the first bars, and the first spaces; the masking material comprising parallel second bars having second spaces therebetween, the second spaces individually having width that is less than width of individual of the second bars, some of the masking material being spaced laterally-outward of the second bars, vertical thickness of the some masking material that is laterally-outward of the second bars having a vertical thickness laterally-outward of the first spaces that is greater than vertical thickness of the second bars, ratio of the vertical thickness of the some masking material that is laterally-outward of the second bars divided by the width of the second bars being 6.0 to 9.6;

forming a flight of stairs in the stack in the scribe-line area that circumferentially-surrounds the horizontal area, the stairs individually comprising a tread comprising one of the first tiers and one of the second tiers; and after forming the registration mark, cutting through the first bars, the first and second tiers, and the flight of stairs in the scribe-line area to form individual die that individually comprise one of the individual die areas.

9. The method of claim 8 wherein the stairs go into the horizontal area.

10. The method of claim 8 wherein the horizontal area comprises four horizontally-spaced peripheral regions that are individually in one of four peripheral quadrants of the horizontal area, a plurality of the second bars and the second spaces being in individual of the four horizontally-spaced peripheral regions.

11. The method of claim 10 wherein a plurality of the first bars and the first spaces are in individual of the four horizontally-spaced peripheral regions.

12. The method of claim 11 wherein the stairs go into the horizontal area and circumferentially-surround individual of the four horizontally-spaced peripheral regions.

13. The method of claim 8 wherein, the flight of stairs includes a first portion that is between an edge of the die area and the horizontal area and runs in a first direction that is perpendicular to the edge of the die area;

the flight of stairs includes a second portion that runs in a second direction that is parallel with the edge of the die area.

14. The method of claim 8 wherein none of the second bars is directly above any part of any of the first bars.

15. The method of claim 8 wherein at least some of the second bars individually include at least a portion thereof that is directly above some portion of some of the first bars.

* * * * *